United States Patent
Kato et al.

(10) Patent No.: US 9,041,358 B2
(45) Date of Patent: May 26, 2015

(54) SEMICONDUCTOR DEVICE FOR BATTERY CONTROL AND BATTERY PACK

(71) Applicant: Renesas Electronics Corporation, Kawasaki-shi, Kanagawa (JP)

(72) Inventors: Daisuke Kato, Kanagawa (JP); Ryosuke Enomoto, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 265 days.

(21) Appl. No.: 13/783,240

(22) Filed: Mar. 2, 2013

(65) Prior Publication Data

US 2013/0257379 A1     Oct. 3, 2013

(30) Foreign Application Priority Data

Mar. 30, 2012   (JP) ................. 2012-079688

(51) Int. Cl.
     *H02J 7/00*      (2006.01)
     *H01L 25/00*      (2006.01)

(52) U.S. Cl.
     CPC ............... *H02J 7/0029* (2013.01); *H01L 25/00* (2013.01)

(58) Field of Classification Search
     CPC ....................................... H02J 7/0029
     USPC ................. 320/128, 134, 136, 137
     See application file for complete search history.

(56) References Cited

U.S. PATENT DOCUMENTS

| | | | |
|---|---|---|---|
| 5,991,221 A | 11/1999 | Ishikawa et al. | |
| 6,462,985 B2 | 10/2002 | Hosono et al. | |
| 7,864,586 B2 * | 1/2011 | Tokiwa | 365/185.18 |
| 2009/0197156 A1 * | 8/2009 | Goto | 429/93 |
| 2012/0206107 A1 * | 8/2012 | Ono et al. | 320/136 |

FOREIGN PATENT DOCUMENTS

| | | |
|---|---|---|
| JP | 10-214496 | 8/1998 |
| JP | 2001-176290 A | 6/2001 |
| JP | 2009-146474 A | 7/2009 |

* cited by examiner

*Primary Examiner* — Richard Isla Rodas
*Assistant Examiner* — Nathaniel Pelton
(74) *Attorney, Agent, or Firm* — Miles & Stockbridge P.C.

(57) ABSTRACT

A semiconductor device for battery control includes a CPU, a first bus coupled to the CPU, a second bus not coupled to the CPU, and a protective function circuit for protecting a battery from stress applied thereto. The semiconductor device also includes a non-volatile memory storing trimming data, a trimming circuit to perform trimming required to allow the protective function circuit to exert a protective function, and a bus control circuit capable of selectively coupling the first bus and the second bus to the non-volatile memory. The semiconductor device further includes a transfer logic circuit which causes, by making the bus control circuit select the second bus, a trimming data transfer path leading from the non-volatile memory to the trimming circuit to be formed and the trimming data stored in the non-volatile memory to be transferred to the trimming circuit without involving the CPU.

8 Claims, 6 Drawing Sheets

SEMICONDUCTOR DEVICE FOR BATTERY CONTROL AND BATTERY PACK

CROSS-REFERENCE TO RELATED APPLICATIONS

The disclosure of Japanese Patent Application No. 2012-079688 filed on Mar. 30, 2012 including the specification, drawings and abstract is incorporated herein by reference in its entirety.

BACKGROUND

The present invention relates to a semiconductor device for battery control and a battery pack and is suitably applicable, particularly, to a battery pack provided with a lithium-ion secondary battery.

In Japanese Unexamined Patent Publication No. 2001-176290, a non-volatile semiconductor storage device is disclosed in which, when turning on of a power supply is detected, the initial setting data read from an initial setting data region is transferred to an initial setting data latching circuit to be retained there.

In Japanese Unexamined Patent Publication No. 2009-146474, a non-volatile semiconductor storage device is disclosed which is provided with a first register group storing various voltage setting data automatically read from a ROM fuse region at a time of a power-on reset and a second register group storing voltage adjustment data read from a cell array region in accordance with inputted addresses.

In Japanese Unexamined Patent Publication No. Hei 10(1998)-214496, a microcomputer having an internal flash memory is disclosed in which the information stored in a special storage area for storing reference voltage trimming information and boosted voltage trimming information is automatically sent to a predetermined register unit in synchronization with resetting of the microcomputer.

SUMMARY

Lithium-ion secondary batteries are a type of non-aqueous electrolyte secondary batteries in which lithium ions in electrolyte effect electric conduction. When a lithium-ion secondary battery is subjected to stress such as an overcurrent or overvoltage, it may ignite or rupture. Such a secondary battery requires, besides a battery power detection IC (Integrated Circuit) for determining the remaining stored charge of the secondary battery, an IC having a protective function circuit for protecting the secondary battery from stress such as an overcurrent or overvoltage.

From the standpoint of reducing the number of parts, however, it is preferable to incorporate the protective function circuit in the battery power detection IC. To realize a high-accuracy protective function in a battery power detection IC including a CPU (Central Processing Unit), a firmware is executed in the CPU to set trimming data and, based on the trimming data, trimming required to exert a protective function in a protective function circuit is performed. However, if the CPU goes out of control or the firmware is rewritten, trimming cannot be performed based on appropriate trimming data. As a result, the secondary battery cannot be kept secure.

Other objects and novel features of the present invention will become clear from the following description and attached drawings.

A typical means of solving the problem according to the present invention is outlined below.

A semiconductor device for battery control is provided with a CPU, a first bus coupled to the CPU, a second bus not coupled to the CPU, and a protective function circuit for protecting a battery from stress applied thereto. The semiconductor device for battery control is also provided with a non-volatile memory storing trimming data, a trimming circuit to perform trimming required to allow the protective function circuit to exert a protective function, and a bus control circuit capable of selectively coupling the first bus and the second bus to the non-volatile memory. The semiconductor device for battery control is further provided with a transfer logic circuit which causes, by making the bus control circuit select the second bus, a trimming data transfer path leading from the non-volatile memory to the trimming circuit to be formed and the trimming data stored in the non-volatile memory to be transferred to the trimming circuit without involving the CPU.

The effect realized by the typical means of solving the problem according to the present invention is summarized below.

Namely, a safe protective function for a secondary battery can be realized by enabling trimming data transfer without CPU involvement.

DETAILED DESCRIPTION

1. Outline of an Embodiment

Figure 1:
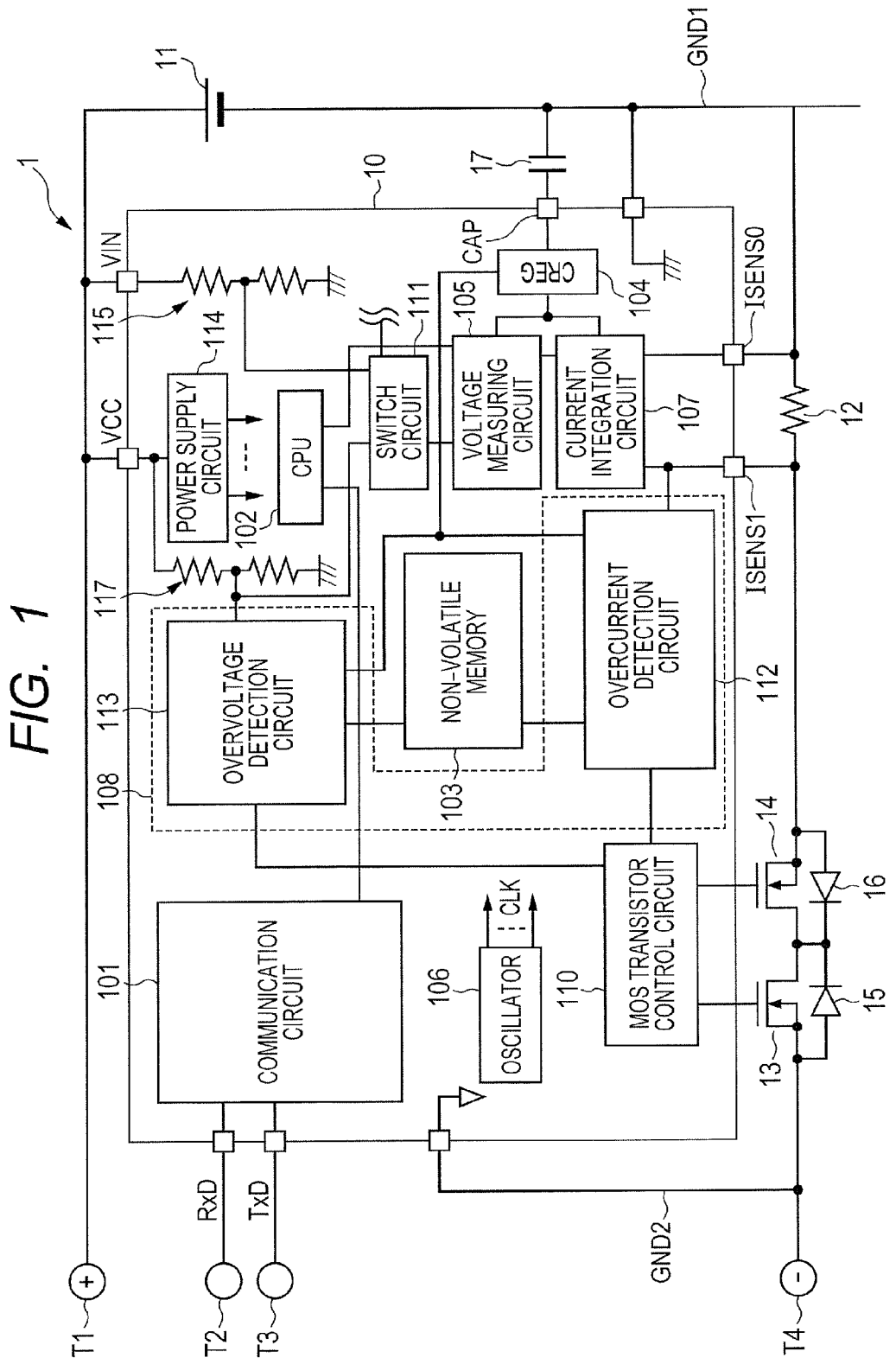
FIG. 1 is a block diagram showing an exemplary configuration of a battery pack.

First, a typical embodiment of the invention disclosed in the present application will be outlined. Note that the reference numerals used in attached drawings and referred to, in parentheses, in the following outline description of a typical embodiment of the present invention merely denote exemplary constituent elements included in the concepts of possible constituent elements.

[1] A semiconductor device for battery control (10) according to a typical embodiment of the present invention includes a CPU (102), a first bus (41) coupled to the CPU, a second bus (42) not coupled to the CPU, and a protective function circuit (108) for protecting a battery from stress applied thereto. The semiconductor device for battery control (10) also includes a non-volatile memory (103) storing trimming data, a trimming circuit (45) to perform trimming required to allow the protective function circuit to exert a protective function, and a bus control circuit (46) capable of selectively coupling the first bus and the second bus to the non-volatile memory. The semiconductor device for battery control (10) further includes a transfer logic circuit (44) which causes, by making the bus control circuit select the second bus, a trimming data transfer path leading from the non-volatile memory to the trimming circuit to be formed and the trimming data stored in the non-volatile memory to be transferred to the trimming circuit without involving the CPU. Based on the trimming data received via the second bus, the trimming circuit (45) performs trimming required to allow the protective function circuit to exert a protective function.

According to the above configuration, the transfer logic circuit causes, by making the bus control circuit select the second bus, a trimming data transfer path leading from the non-volatile memory to the trimming circuit to be formed and the trimming data stored in the non-volatile memory to be transferred to the trimming circuit without involving the CPU. Thus, the trimming data stored in the non-volatile memory is transferred to the trimming circuit without involving the CPU. Hence, it is possible to set appropriate trimming data in the trimming circuit even if the CPU goes out of control or the firmware in the semiconductor device for battery control is rewritten. Moreover, the second bus is not coupled to the CPU, so that the CPU cannot access the trimming circuit via the first bus. Therefore, even if the firmware in the semiconductor device for battery control is rewritten, the CPU can neither delete nor alter the trimming data set in the trimming circuit. This allows the secondary battery to be kept secure.

[2] The non-volatile memory can be configured to include a first storage area (103A) accessible by a user of the semiconductor device for battery control and a second storage area (103B) not accessible by the user. In the configuration, the trimming data can be stored in the second storage area. Since the second storage area is not accessible by the user, the user can neither alter nor delete the trimming data. This makes it possible to enhance the security of the trimming data stored in the second storage area.

[3] The transfer logic circuit can be configured to assert a transfer completion signal after having the trimming data in the non-volatile memory transferred to the trimming circuit via the second bus. In the configuration, the CPU is activated after the transfer completion signal is asserted. Hence, activation of the CPU is not affected by the transfer of the trimming data.

[4] The trimming circuit can be provided with a first trimming circuit (451), a second trimming circuit (452), a third trimming circuit (453), a fourth trimming circuit (454), a fifth trimming circuit (455), and a sixth trimming circuit (456). The first trimming circuit (451) trims, in accordance with the trimming data, a first reference voltage referred to for detecting an overvoltage during charging of the battery. The second trimming circuit (452) trims, in accordance with the trimming data, a second reference voltage referred to for detecting an overcurrent during charging of the battery. The third trimming circuit (453) trims, in according with the trimming data, a third reference voltage referred to for detecting a discharge overvoltage during discharging of the battery. The fourth trimming circuit (454) trims, in accordance with the trimming data, a fourth reference voltage referred to for detecting a short-circuit during discharging of the battery. The fifth trimming circuit (455) trims, in accordance with the trimming data, a voltage dividing ratio of a voltage dividing resistor for overvoltage detection during charging of the battery. The sixth trimming circuit (456) trims, in accordance with the trimming data, a voltage dividing ratio of a voltage dividing resistor for discharge overvoltage detection during discharging of the battery. Thus, the first reference voltage, the second reference voltage, the third reference voltage, the fourth reference voltage, and the voltage dividing ratio of the voltage dividing resistor can be trimmed in accordance with the trimming data.

[5] The trimming circuit can be provided with a seventh trimming circuit (457) for trimming, in accordance with the trimming data, a time required to determine overvoltage detection during charging of the battery, a time required to determine overcurrent detection during charging of the battery, a time required to determine discharge overvoltage detection during discharging of the battery, and a time required to determine short-circuit detection during discharging of the battery. This makes it possible to trim the time required to determine overvoltage detection during charging of the battery, the time required to determine overcurrent detection during charging of the battery, the time required to determine discharge overvoltage detection during discharging of the battery, and the time required to determine short-circuit detection during discharging of the battery.

[6] The transfer logic circuit causes the trimming data stored in the non-volatile memory to be transferred to the trimming circuit without involving the CPU. This is done, based on a power-on reset signal, by making the bus control circuit select the second bus to cause a trimming data transfer path leading from the non-volatile memory to the trimming circuit to be formed. Thus, the trimming data stored in the non-volatile memory can be sent to the trimming circuit responding to a power-on reset signal.

[7] The semiconductor device for battery control (10) can be configured to include a MOS transistor (13) coupled in series to a battery. The semiconductor device for battery control including the MOS transistor can generate the effects as described in [1] to [6] above.

[8] A battery pack (1) according to a typical embodiment of the present invention can be configured to include a rechargeable battery (11) and the semiconductor device for battery control capable of controlling charging of the battery. The battery pack including the rechargeable battery and the semiconductor device for battery control capable of controlling charging of the battery can generate the effects as described in [1] to [6] above.

2. Details of Embodiment

The embodiment will be described in further detail below.

An example of a battery pack configuration is shown in FIG. 1.

A battery pack 1 shown in FIG. 1 includes a battery 11, an IC (integrated circuit) 10 for battery control, a sense resistor 12, a charging MOS transistor 13, and a discharging MOS transistor 14. The battery pack 1 is sealed by, for example, insulating resin. The charging MOS transistor 13 and the discharging MOS transistor 14 may each be, though not limited to, an n-channel MOS transistor. The battery pack 1 is provided with terminals T1, T2, T3, and T4. The terminal T1 is a positive (+) terminal. The terminal T4 is a negative (−) terminal. The terminal T2 is a terminal for data reception. The terminal T3 is a terminal for data transmission. The terminals T1, T2, T3, and T4 of the battery pack 1 are coupled to a battery charger, not shown, which charges the battery pack 1. The battery pack 1 that has been charged is installed, for example, in a mobile terminal or a digital camera and functions as a power supply for operating the electronic circuit of the mobile terminal or digital camera.

While not limited thereto, the IC 10 for battery control is formed on a semiconductor substrate of, for example, monocrystal silicon using a known semiconductor integrated circuit fabrication technique. The battery 11 is a lithium-ion secondary battery. Charging of the battery 11 is controlled by the IC 10 for battery control. The IC 10 for battery control is externally attached with the charging MOS transistor 13, the discharging MOS transistor 14, and the sense resistor 12. The charging MOS transistor 13, the discharging MOS transistor 14, and the sense resistor 12 are coupled in series to the battery 11. Turning on and off of the charging MOS transistor 13 and the discharging MOS transistor 14 is controlled by the IC 10 for battery control. The path between the battery 11 and the sense resistor 12 is at a potential of a first ground GND1. The path between the discharging MOS transistor 14 and the terminal T4 is at a potential of a second ground GND2.

While not limited thereto, the IC 10 for battery control includes a communication circuit 101, a CPU 102, a non-volatile memory 103, a high-accuracy power supply (CREG) 104, a voltage measuring circuit 105, an oscillator 106, a current integration circuit 107, a protective function circuit 108, a MOS transistor control circuit 110, and a switch circuit 111.

The communication circuit 101 exchanges battery pack 1 identification data and control data for charging/discharging of the battery pack 1 with a battery charger or a mobile terminal coupled thereto.

The CPU 102 controls charging of the battery pack 1 in accordance with a preset program.

The non-volatile memory 103 stores programs to be executed by the CPU 102 and trimming information for various parts.

The high-accuracy power supply 104 generates constant voltages of various levels based on the voltage inputted from outside to the IC 10 for battery control. The constant voltages thus generated are supplied as voltages having relatively high stability to various parts. Such voltages include, for example, voltages supplied to resistors used for voltage dividing and reference voltages supplied to comparator circuits. The high-accuracy power supply 104 is externally attached, via a CAP terminal, with a smoothing capacitor 17.

The voltage measuring circuit 105 measures a positive voltage V1 of the battery 11 based on the first ground GND1 as a reference. The result of the voltage measurement is converted into a digital signal and is sent to the CPU 102.

The oscillator 106 generates a clock signal CLK for logic circuit operation in the IC 10 for battery control. The clock signal CLK is supplied to various parts of the IC 10 for battery control.

The current integration circuit 107 measures the charging/discharge current of the battery 11 by monitoring, via ISENS0 and ISENS1 terminals, the voltage across both ends of the sense resistor 12. The result of the current measurement is converted into a digital signal and is transmitted to the CPU 102.

The protective function circuit 108 is provided to protect the battery 11 from stress, for example, an overvoltage or overcurrent. The protective function circuit 108 includes, as being described later, an overcurrent detection circuit 112 and an overvoltage detection circuit 113. The overcurrent detection circuit 112 collects the terminal voltage of the sense resistor 12 via the ISENS1 terminal and, based on the voltage, detects an overcurrent state. The overvoltage detection circuit 113 collects a divided voltage obtained by dividing the voltage conveyed via a VCC terminal using a voltage dividing resistor 117 and, based on the divided voltage, detects an overvoltage state. The results of detection by the overcurrent detection circuit 112 and the overvoltage detection circuit 113 are sent to the MOS transistor control circuit 110.

The MOS transistor control circuit 110 controls turning on/off of the charging MOS transistor 13 and the discharging MOS transistor 14 based on the control signals from the CPU 102 and the results of detection by the overcurrent detection circuit 112 and the overvoltage detection circuit 113. The charging MOS transistor 13 is turned on when charging the battery 11 and is turned off when the battery 11 has risen to a predetermined voltage level.

In a state where the charging MOS transistor 13 is off, the battery 11 cannot be charged, but the battery 11 can be discharged via a parasitic diode 15 coupled in parallel to the charging MOS transistor 13. When a state of overvoltage or overcurrent is detected while the battery 11 is being charged, the MOS transistor control circuit 110 turns off the charging MOS transistor 13, thereby causing charging of the battery 11 to be discontinued.

When the voltage of the battery 11 lowers to a predetermined level (discharge overvoltage level), the MOS transistor control circuit 110 turns off the discharging MOS transistor 14. This blocks the discharge current from the battery 11. In a state where the discharging MOS transistor 14 is off, the battery 11 cannot be discharged, but the battery 11 can be charged via a parasitic diode 16 coupled in parallel to the discharging MOS transistor 14. When a short-circuit current is detected while the battery 11 is being discharged, the MOS transistor control circuit 110 turns off the discharging MOS transistor 14, thereby blocking the short-circuit current.

The switch circuit 111 selectively supplies plural analog signals to the voltage measuring circuit 105 and, thereby, allows the voltages of the plural analog signals to be measured. The plural analog signals include a voltage generated by dividing, using the voltage dividing resistor 115, the voltage obtained via a VIN terminal, a voltage generated by dividing, using the voltage dividing resistor 117, the voltage obtained via the VCC terminal, and an output signal of a thermistor (not shown) for temperature detection provided in a vicinity of the battery 11.

The power supply circuit 114 collects, via the VCC terminal, the voltage supplied from the battery 11 and steps down the collected voltage thereby generating supply voltages for operating principal circuits of the IC for battery control.

Figure 2:
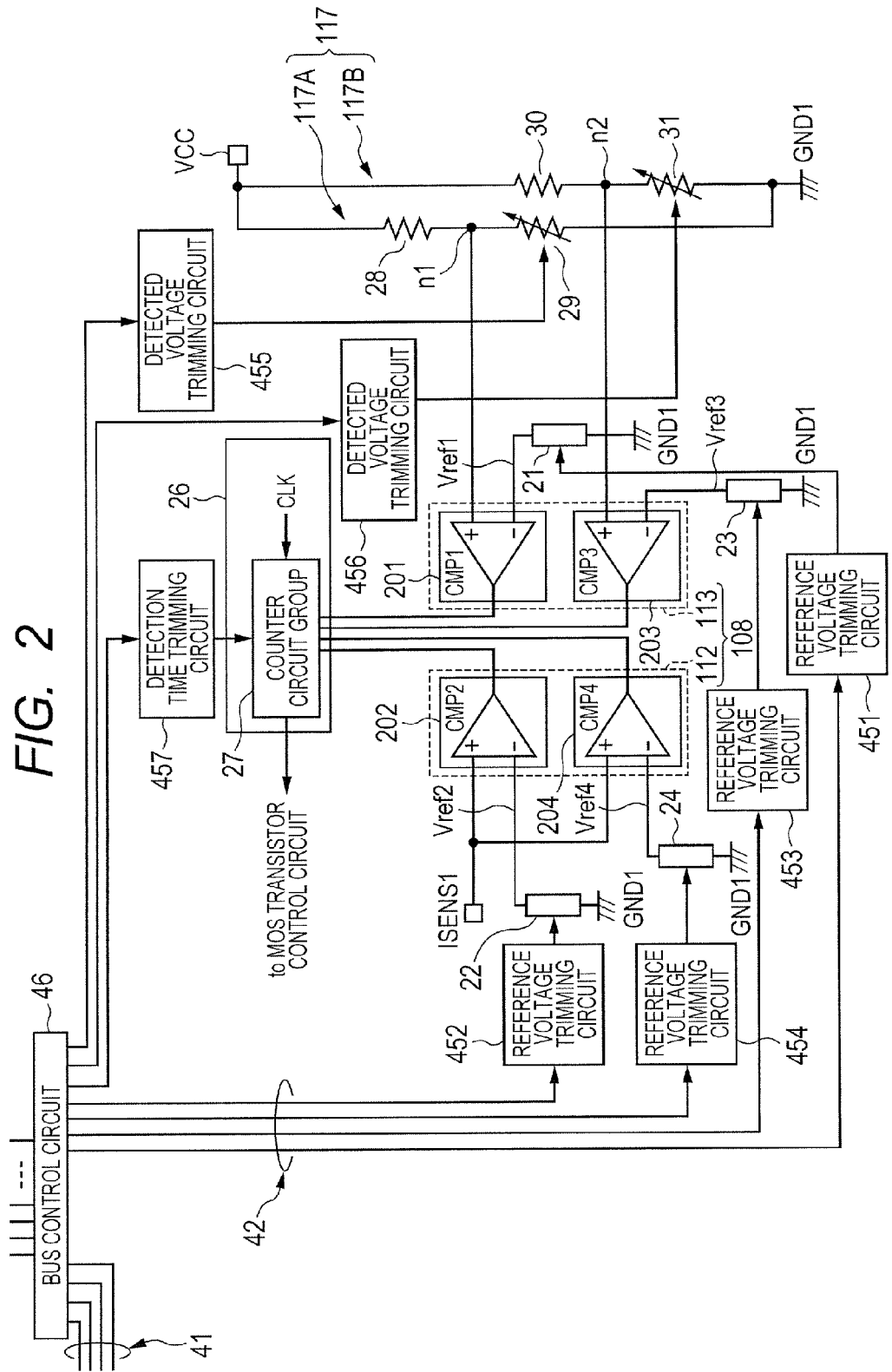
FIG. 2 is a detailed block diagram showing an exemplary configuration of a protective function circuit included in the battery pack shown in FIG. 1 and a peripheral part thereof.

FIG. 2 shows a detailed example of configuration of the protective function circuit 108 and a peripheral part thereof.

The voltage dividing resistor 117 includes a first voltage dividing resistor 117A comprised of series-coupled resistors 28 and 29 and a second voltage dividing resistor 117B comprised of series-coupled resistors 30 and 31. The resistors 28 and 30 are applied with the voltage of the battery 11. The resistors 29 and 31 are coupled to the first ground GND1. The values of the resistors 29 and 31 are variable. In the present example, a detected voltage trimming circuit 455 for trimming the detected voltage of the battery 11 by varying the value of the resistor 29 and a detected voltage trimming circuit 456 for trimming the detected voltage of the battery 11 by varying the value of the resistor 31 are provided. The detected voltage trimming circuit 455 is provided with a trimming data setting register and trims the detected voltage of the battery 11 by varying the value of the resistor 29 based on the trimming data set in the trimming data setting register. The detected voltage trimming circuit 456 is provided with a trimming data setting register and trims the detected voltage of the battery 11 by varying the value of the resistor 31 based on the trimming data set in the trimming data setting register.

The protective function circuit 108 includes the overvoltage detection circuit 113 and the overcurrent detection circuit 112. The overvoltage detection circuit 113 includes a charge overvoltage detection circuit 201 which detects an overvoltage of the battery 11 during charging, an overcurrent detection circuit 202 which detects an overcurrent of the battery 11 during charging, a discharge overvoltage detection circuit 203 which detects an overvoltage of the battery 11 during discharging, and a short-circuit detection circuit 204 which detects short-circuiting of the battery 11 during discharging. The charge overvoltage detection circuit 201, overcurrent detection circuit 202, discharge overvoltage detection circuit 203, and short-circuit detection circuit 204 can be comprised of comparators CMP1, CMP2, CMP3, and CMP4, respectively.

The non-inverted input terminal (+) of the comparator CMP1 receives the voltage appearing at a series coupling node n1 between the resistors 28 and 29 included in the first voltage dividing resistor 117A. The inverted input terminal (−) of the comparator CMP1 receives a first reference voltage Vref1 generated at a reference voltage generation part 21. The comparator CMP1 detects an overvoltage during charging by comparing the voltage appearing at the series coupling node n1 between the resistors 28 and 29 and the first reference voltage Vref1.

The non-inverted input terminal (+) of the comparator CMP2 receives the terminal voltage of the sense resistor 12 via the ISENS1 terminal. The inverted terminal (−) of the comparator CMP2 receives a second reference terminal voltage generated at a reference voltage generation part 22. The comparator CMP2 detects an overcurrent by comparing the terminal voltage of the sense resistor 12 received via the ISENS1 terminal and the second reference voltage Vref2.

The non-inverted input terminal (+) of the comparator CMP3 receives the voltage appearing at a series coupling node n2 between the resistors 30 and 31 included in the first voltage dividing resistor 117B. The inverted input terminal (−) of the comparator CMP3 receives a third reference voltage Vref3 generated at a reference voltage generation part 23. The comparator CMP3 detects an overvoltage during discharging by comparing the voltage appearing at the series coupling node n2 between the resistors 30 and 31 and the third reference voltage Vref3.

The non-inverted input terminal (+) of the comparator CMP4 receives the terminal voltage of the sense resistor 12 via the ISENS1 terminal. The inverted input terminal (−) of the comparator CMP4 receives a fourth reference voltage Vref4 generated at a reference voltage generation part 24. The comparator CMP4 detects a short-circuit state between the terminals T1 and T4 by comparing the terminal voltage of the sense resistor 12 received via the ISENS1 terminal and the fourth reference voltage Vref4.

Figure 3:
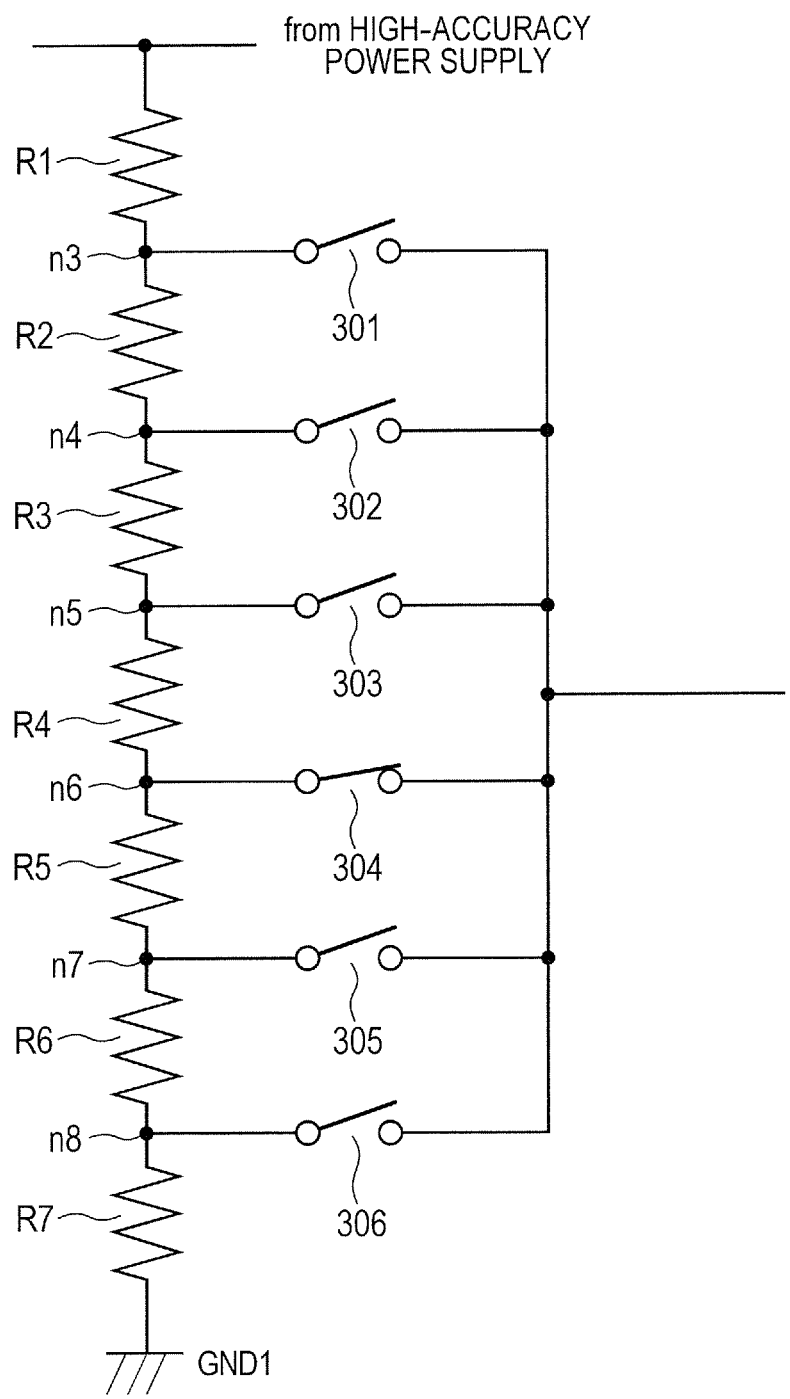
FIG. 3 is a circuit diagram showing an exemplary configuration of the reference voltage generation part shown in FIG. 2.

The reference voltage generation parts 21, 22, 23, and 24 can each be configured, for example, as shown in FIG. 3, to include plural series-coupled resistors R1 to R7 and switch elements 301 to 306. The resistor R1 is supplied with a constant voltage generated at the high-accuracy power supply 104. The resistor R7 is coupled to the first ground GND1. The potential at each of the series coupling nodes n3 to n8 of the resistors R1 to R7 can be taken out via the corresponding switch elements 301 to 306. Namely, when any of the switch elements 301 to 306 is turned on, a reference voltage corresponding to the voltage dividing ratio of the resistors at that time is generated. Which one of the switch elements 301 to 306 to turn on is determined by the outputs of the reference voltage trimming circuits 451, 452, 543, and 454. Namely, the reference voltage trimming circuits 451, 452, 453, and 454 provided correspondingly to the reference voltage generation parts 21, 22, 23, and 24 trim the voltages generated by the reference voltage generation parts 21, 22, 23, and 24, respectively. The reference voltage trimming circuits 451, 452, 453, and 454 are each provided with a trimming data setting register. The values of the reference voltages Vref1, Vref2, Vref3, and Vref4 are appropriately determined based on the trimming data set in the trimming data setting registers. Setting trimming data in the trimming data setting registers will be described later.

The outputs (comparison results) of the comparators CMP1, CMP2, CMP3, and CMP4 are inputted to a determination circuit 26 provided to determine the results of detection by the comparators CMP1, CMP2, CMP3, and CMP4. If turning on/off of the charging MOS transistor 13 and the discharging MOS transistor 14 is controlled immediately in response to output assertions by the comparators CMP1, CMP2, CMP3, and CMP4, the control may become unstable. To avoid such control instability, a detection time is predetermined for each of the comparators CMP1, CMP2, CMP3, and CMP4, and the output assertion by each of the comparators CMP1, CMP2, CMP3, and CMP4 is ignored unless the duration of the output assertion reaches the corresponding detection time. When the duration of the output assertion of any of the comparators CMP1, CMP2, CMP3, and CMP4 reaches the corresponding detection time, it is reflected on the control of turning on/off of the charging MOS transistor 13 or the discharging MOS transistor 14. When, for example, an output assertion by the comparator CMP1 continues as long as the corresponding detection time, the battery 11 is determined to have entered a state of overvoltage while being charged and the charging MOS transistor 13 is turned off. When an output assertion by the comparator CMP2 continues as long as the corresponding detection time, the battery 11 is determined to have entered a state of overcurrent while being charged and the charging MOS transistor 13 is turned off. When an output assertion by the comparator CMP3 continues as long as the corresponding detection time, the voltage of the battery 11 is determined to have lowered below a predetermined voltage during discharging and the discharging MOS transistor 14 is turned off. When an output assertion by the comparator CMP4 continues as long as the corresponding detection time, the terminals T1 and T4 are determined to have been short-circuited during discharging and the discharging MOS transistor 14 is turned off. Whether the output assertions by the comparators CMP1, CMP2, CMP3, and CMP4 have continued as long as the respective detection times is determined by a counter group 27. The counter group 27 includes four counters corresponding to the comparators CMP1, CMP2, CMP3, and CMP4. When the output of any of the comparators CMP1, CMP2, CMP3, and CMP4 is asserted, the corresponding one of the four counters starts counting the clock signal CLK. When the output of the comparator is negated, the corresponding counter is cleared. The detection time can be trimmed by selecting the output terminal of the corresponding counter as required. In the present example, a detection time trimming circuit 457 for trimming the detection time is provided. The detection time trimming circuit 457 is provided with trimming data setting registers. The detection time is trimmed based on the trimming data set in the trimming data setting registers.

The trimming data is stored in the non-volatile memory 103. The trimming data stored in the non-volatile memory 103 is set, via a trimming data bus 42 selected by the bus control circuit 46, in the trimming data setting registers provided for the reference voltage trimming circuits 451 to 454, detected voltage trimming circuits 455 and 456, and detection time trimming circuit 457.

Setting of the trimming data in the trimming data setting registers will be described below.

Figure 4:
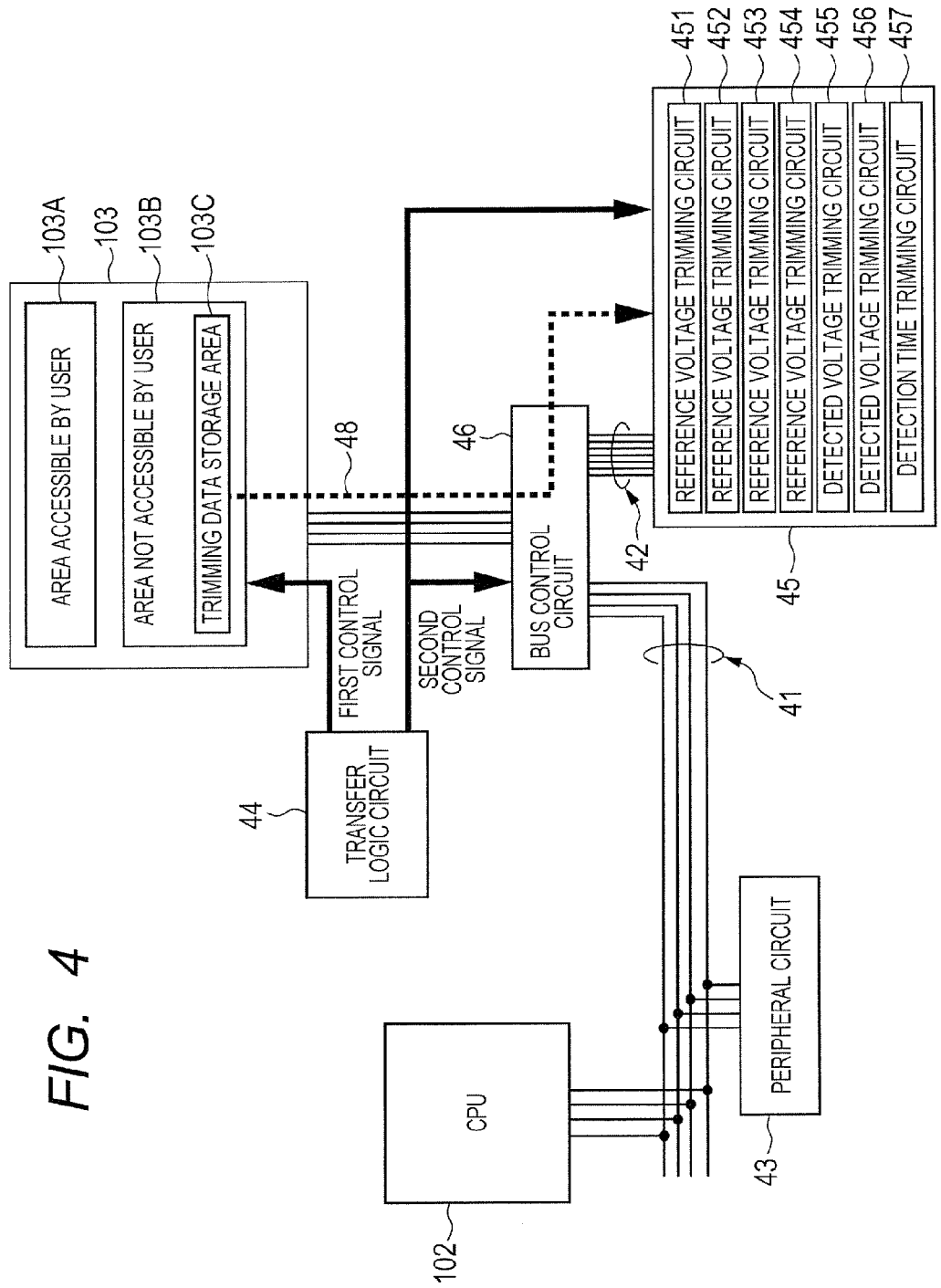
FIG. 4 is a detailed block diagram showing an exemplary configuration of a main part of the battery pack shown in FIG. 1.

In the present example, as shown in FIG. 4, the trimming data bus 42 that is not coupled to the CPU 102 is provided separately from a system bus 41 coupled to the CPU 102. The bus control circuit 46 selectively couples the system bus 41 and the trimming data bus 42 to the non-volatile memory 103. The non-volatile memory 103 includes a storage area 103A, accessible by the user, of the IC10 for battery control and a storage area 103B, not accessible by the user, of the IC10 for battery control. The storage area 103A stores programs for execution by the CPU 102. The storage area 103B includes a trimming data storage area 103C to which trimming data is written by a vendor. The trimming circuit 45 is coupled to the trimming data bus 42. The trimming circuit 45 includes the reference voltage trimming circuits 451 to 454, detected voltage trimming circuits 455 and 456 and detection time trimming circuit 457 that are shown in FIG. 2. The selection operation of the bus control circuit 46 is controlled by a transfer logic circuit 44.

Figure 5:
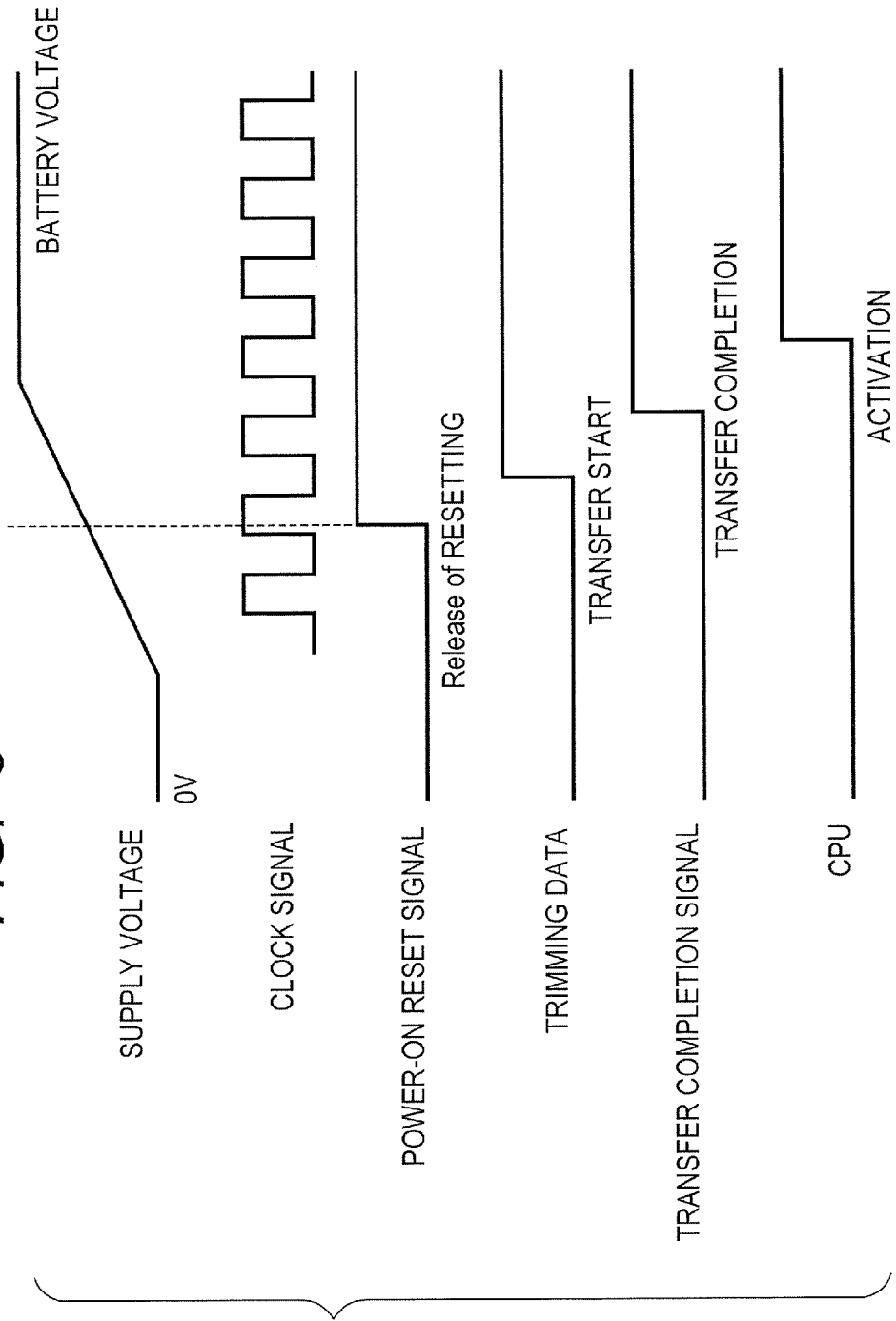
FIG. 5 is a timing chart of operations of main parts of the battery pack shown in FIG. 1.

FIG. 5 shows operation timings of principal parts.

In the production process of the battery pack 1, when the battery 11 is coupled to the IC 10 for battery control, the voltage level at the VCC terminal of the IC 10 for battery control rises from 0 V and reaches the voltage level of the battery 11. The oscillator 106 starts oscillation at a relatively low level of the supply voltage and generates the clock signal CLK. During the process in which the voltage at the VCC terminal rises from 0 V to the voltage of the battery 11, a power-on reset signal is generated. The power-on reset signal may be generated using an IC for resetting or using a simple circuit which is configured to delay rising of a reset signal using a resistor-capacitor time constant. The resetting state is released when the power-on reset signal has risen from a low level to a high level. First, after the resetting state is released, trimming data starts being transferred. When the trimming data has been transferred, the CPU 102 is activated.

Namely, when the power-on reset signal rises from a low level to a high level causing the resetting state to be released, the transfer logic circuit 44 generates, as shown in FIG. 4, a first control signal including the read address of the trimming data storage area 103C of the non-volatile memory 103 and a second control signal for controlling the operation of the bus control circuit 46 and the trimming circuit 45. Responding to the second control signal, the bus control circuit 46 selectively couples the trimming data bus 42 to the non-volatile memory 103 thereby forming a trimming data transfer path leading from the non-volatile memory 103 to the trimming circuit 45. Responding to the first control signal including read addresses of the trimming data storage area 103C, the non-volatile memory 103 puts plural memory cells corresponding to the trimming data storage area 103C in a selected state thereby causing the trimming data stored in the memory cells to be outputted. The trimming data thus outputted is, as shown by a broken-line arrow 48 in FIG. 4, set in the trimming data setting registers of the trimming circuit 45 via the bus control circuit 46 and the trimming data bus 42. In this way, the trimming data is set in the trimming data setting registers included in the reference voltage trimming circuits 451 to 454, detected voltage trimming circuits 455 and 456, and detection time trimming circuit 457. At this stage, the CPU 102 has not yet been activated. When the trimming data has been set as described above, the transfer logic circuit 44 asserts a transfer completion signal by raising it to a high level. The assertion of the transfer completion signal is a condition for activating the CPU 102. Thus, the CPU 102 is activated after the transfer completion signal is asserted.

Figure 6:
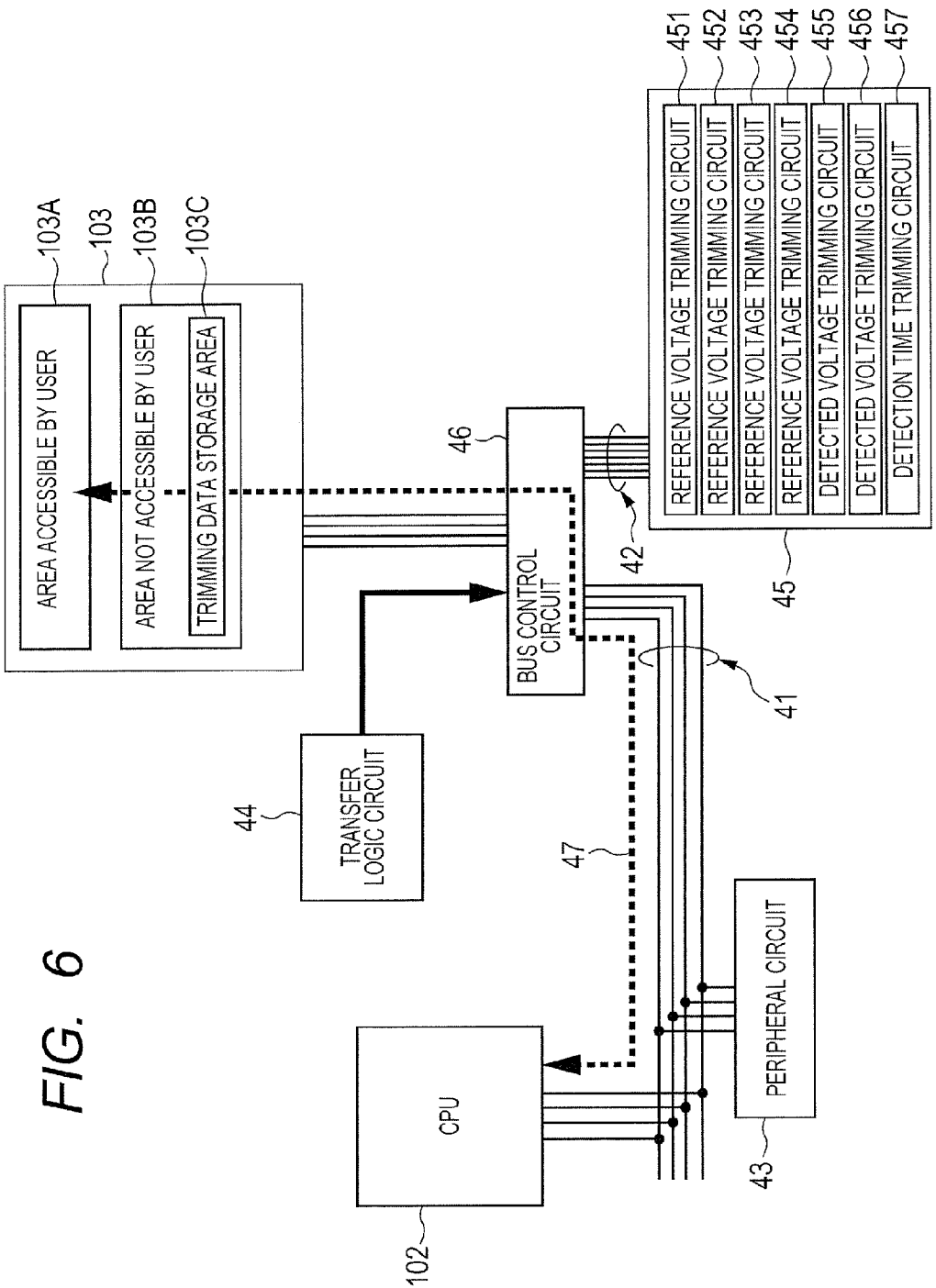
FIG. 6 is a detailed block diagram showing an exemplary configuration of a main part of the battery pack shown in FIG. 1.

Almost at the same time as the transfer completion signal is asserted, the transfer logic circuit 44, responding to the second control signal, decouples the trimming data bus 42 from the non-volatile memory 103 and couples the system bus 41 to the non-volatile memory 103. With the system bus 41 coupled to the non-volatile memory 103 by the bus control circuit 46, the CPU 102 can read/write information from/to the storage area 103A of the non-volatile memory 103 as shown by a broken arrow line 47 in FIG. 6. The CPU 102 can also set data in registers included in the peripheral circuit 43 coupled to the system bus 41. Without the system bus 41 and the trimming data bus 42 being coupled to each other, however, the CPU 102 cannot access the trimming data setting registers included in the trimming circuit 45.

According to the present embodiment, the following operations and effects can be achieved.

The transfer logic circuit 44 can have the trimming data in the non-volatile memory 103 transferred to the trimming circuit 45 without involving the CPU 102. This is done by having the bus control circuit 46 select the trimming data bus 42 thereby forming a trimming data transfer path leading from the non-volatile memory 103 to the trimming circuit 45. As described above, when the trimming data in the non-volatile memory 103 is transferred to the trimming circuit 45, the CPU 102 is not involved. Hence, appropriate trimming data can be set in the trimming circuit 45 even in cases where the CPU 102 goes out of control or where programs (firmware) in the non-volatile memory 103 are rewritten. Moreover, since the trimming data bus 42 is not coupled to the CPU 102, the CPU 102 cannot access the trimming circuit 45 via the system bus 41. Namely, even if programs in the non-volatile memory 103 are maliciously rewritten, the CPU 102 can neither delete nor alter the trimming data set in the trimming circuit 45. This keeps the battery 11 secure.

The invention made by the present inventors has been concretely described based on an embodiment, but, obviously, the invention is not limited to the embodiment and can be variously changed without departing from the scope of the invention.

For example, the non-volatile memory 103 may be a ROM (Read Only Memory).

What is claimed is:

1. A semiconductor device for battery control comprising:
   a CPU;
   a first bus coupled to the CPU;
   a second bus not coupled to the CPU;
   a protective function circuit for protecting a battery from stress applied thereto;
   a non-volatile memory storing trimming data;
   a trimming circuit to perform trimming required to allow the protective function circuit to exert a protective function;
   a bus control circuit capable of selectively coupling the first bus and the second bus to the non-volatile memory, and
   a transfer logic circuit which causes, by making the bus control circuit select the second bus, a trimming data transfer path leading from the non-volatile memory to the trimming circuit to be formed and the trimming data stored in the non-volatile memory to be transferred to the trimming circuit without involving the CPU,
   wherein, in accordance with the trimming data received via the second bus, the trimming circuit performs trimming required to allow the protective function circuit to exert a protective function.

2. The semiconductor device for battery control according to claim 1,
   wherein the non-volatile memory includes a first storage area accessible by a user of the semiconductor device for battery control and a second storage area not accessible by the user, and
   wherein the trimming data is stored in the second storage area.

3. The semiconductor device for battery control according to claim 2,
   wherein the transfer logic circuit asserts a transfer completion signal after having the trimming data in the non-volatile memory transferred to the trimming circuit via the second bus, and
   wherein the CPU is activated after the transfer completion signal is asserted.

4. The semiconductor device for battery control according to claim 3, wherein the trimming circuit includes;
   a first trimming circuit for trimming, in accordance with the trimming data, a first reference voltage which is referred to for overvoltage detection during charging of the battery;
   a second trimming circuit for trimming, in accordance with the trimming data, a second reference voltage which is referred to for overcurrent detection during charging of the battery;
   a third trimming circuit for trimming, in accordance with the trimming data, a third reference voltage which is referred to for discharge overvoltage detection during discharging of the battery,
   a fourth trimming circuit for trimming, in accordance with the trimming data, a fourth reference voltage which is referred to for short-circuit detection during discharging of the battery;
   a fifth trimming circuit for trimming, in accordance with the trimming data, a voltage dividing ratio of a voltage dividing resistor for overvoltage detection during charging of the battery, and
   a sixth trimming circuit for trimming, in accordance with the trimming data, a voltage dividing ratio of a voltage dividing resistor for discharge overvoltage detection during discharging of the battery.

5. The semiconductor device for battery control according to claim 4, wherein the trimming circuit further includes a seventh trimming circuit for trimming, in accordance with the trimming data, a time required to determine overvoltage detection during charging of the battery, a time required to determine overcurrent detection during charging of the battery, a time required to determine discharge overvoltage detection during discharging of the battery, and a time required to determine short-circuit detection during discharging of the battery.

6. The semiconductor device for battery control according to claim 5, wherein, based on a power-on reset signal generated when a voltage supply from the battery is started, the transfer logic circuit causes, by making the bus control circuit select the second bus, a trimming data transfer path leading from the non-volatile memory to the trimming circuit to be formed and the trimming data stored in the non-volatile memory to be transferred to the trimming circuit without involving the CPU.

7. A semiconductor device for battery control comprising:
   a MOS transistor coupled in series to a battery;
   a CPU capable of controlling the MOS transistor;
   a first bus coupled to the CPU;
   a second bus not coupled to the CPU;
   a protective function circuit for protecting the battery from stress applied thereto;
   a non-volatile memory storing trimming data;
   a trimming circuit to perform trimming required to allow the protective function circuit to exert a protective function;
   a bus control circuit capable of selectively coupling the first bus and the second bus to the non-volatile memory, and
   a transfer logic circuit which causes, by making the bus control circuit select the second bus, a trimming data transfer path leading from the non-volatile memory to the trimming circuit to be formed and the trimming data stored in the non-volatile memory to be transferred to the trimming circuit without involving the CPU;
   wherein, in accordance with the trimming data received via the second bus, the trimming circuit performs trimming required to allow the protective function circuit to exert a protective function.

8. A battery pack including a chargeable battery and a semiconductor device for battery control which can control charging of the battery, the semiconductor device for battery control comprising:
   a MOS transistor coupled in series to the battery;
   a CPU capable of controlling the MOS transistor;
   a first bus coupled to the CPU;
   a second bus not coupled to the CPU;
   a protective function circuit for protecting the battery from stress applied thereto;
   a non-volatile memory storing trimming data;
   a trimming circuit to perform trimming required to allow the protective function circuit to exert a protective function;
   a bus control circuit capable of selectively coupling the first bus and the second bus to the non-volatile memory, and
   a transfer logic circuit which causes, by making the bus control circuit select the second bus, a trimming data transfer path leading from the non-volatile memory to the trimming circuit to be formed and the trimming data stored in the non-volatile memory to be transferred to the trimming circuit without involving the CPU,
   wherein, in accordance with the trimming data received via the second bus, the trimming circuit performs trimming required to allow the protective function circuit to exert a protective function.

* * * * *